United States Patent [19]

Inoue et al.

[11] Patent Number: 4,847,848
[45] Date of Patent: Jul. 11, 1989

[54] SEMICONDUCTOR LASER DEVICE

[75] Inventors: Yasuaki Inoue, Kyoto; Kimihide Minakuchi; Norio Tabuchi, both of Osaka, all of Japan

[73] Assignee: Sanyo Electric Co., Ltd., Moriguchi, Japan

[21] Appl. No.: 157,049

[22] Filed: Feb. 16, 1988

[30] Foreign Application Priority Data

Feb. 20, 1987 [JP] Japan .................................. 62-38251
Mar. 20, 1987 [JP] Japan ............................ 62-41133[U]

[51] Int. Cl.⁴ ........................ H01S 3/19; H01L 31/12; G02B 6/36
[52] U.S. Cl. ....................................... 372/50; 372/97; 372/107; 372/108; 357/19; 357/75; 350/96.2; 350/96.3
[58] Field of Search ................... 372/50, 97, 107, 108; 357/19, 75; 350/96.2, 96.3

[56] References Cited

U.S. PATENT DOCUMENTS 4,464,758  8/1984  Chenausky et al. .................. 372/97

FOREIGN PATENT DOCUMENTS 0075656  4/1984  Japan ..................................... 357/19
0182779  9/1985  Japan ..................................... 357/19

OTHER PUBLICATIONS

Electronic Material, vol. 26, No. 6, 1987, pp. 107–111.

Primary Examiner—William L. Sikes
Assistant Examiner—Georgia T. Epps
Attorney, Agent, or Firm—Darby & Darby

[57] ABSTRACT

A semiconductor laser device comprises: a semiconductor laser including laser resonators for emitting laser beams forward and backward oppositely along a plurality of parallel axes; a photodetector including a plurality of photodetector elements for detecting intensities of the laser beams emitted backward; and a waveguide located between the semiconductor laser and the photodetector for guiding the backward emitted laser beams to the corresponding ones of the photodetector elements, the waveguide including a plurality of guide grooves for guiding the backward emitted laser beams.

24 Claims, 7 Drawing Sheets

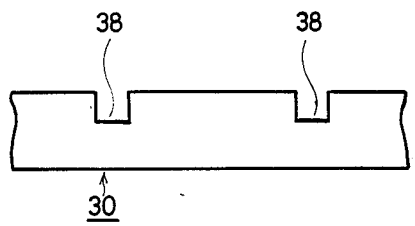
FIG.9A
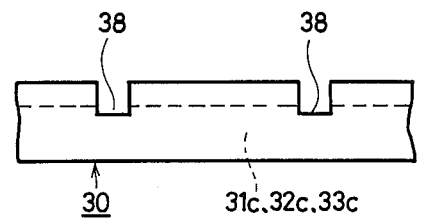
FIG.9B
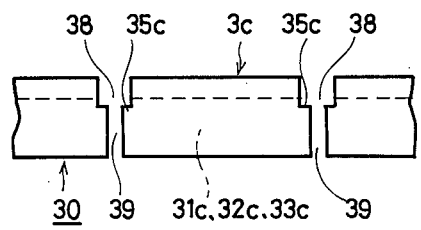
FIG.9C
FIG.10
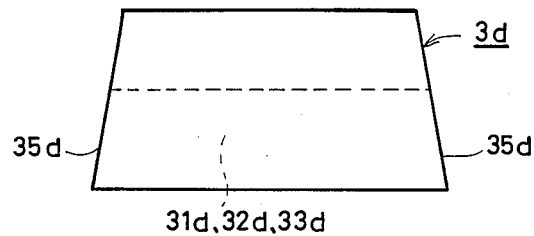

SEMICONDUCTOR LASER DEVICE

BACKGROUND OF THE INVENTION

1. Field of the Invention

The present invention relates to a semiconductor laser device and particularly to a laser device for use in an optical memory or the like, which emits a plurality of beams.

2. Description of the Prior Art

Japanese Utility Model Laying-Open Gazette No. 152474/1987 describes that a semiconductor laser device for emitting laser beams along a plurality of parallel axes (i.e., a multibeam laser device) is suitably used as a light source for an optical memory or the like. For example, a multibeam laser device having three parallel laser resonators, the outputs of which can be controlled independently of one another, is able to record, reproduce and erase data on an optical memory by using three beams emitted from the respective laser resonators. Thus, it becomes possible to detect recording errors in real time, to control recording conditions and to simultaneously record and reproduce data.

Generally, since output characteristics of a semiconductor laser are very sensitive to environmental conditions such as changes in temperature, one of the two beams emitted in opposite directions along an axis from both ends of a semiconductor laser resonator is used for application of a signal and the other beam is used for monitoring of an optical output of the laser resonator (as disclosed for example in Japanese Patent Laying-Open Gazette No. 102590/1983). In the monitoring, light intensity of the beam is measured by a photodetector (e.g., a PIN diode) intersecting with the beam path. Thus, electric power supplied to the laser resonator is controlled based on the monitoring result so that intensity of the laser beam used for the signal becomes a predetermined value.

FIG. 1 is a schematic illustration of a three-beam laser device of the prior art used in an optical pickup for an optical memory. A semiconductor laser 1 for emitting beams along three axes is set on a heat sink 4 of silicon fixed to an L-shaped block 5 of copper and the like. The semiconductor laser 1 includes three laser resonators, the outputs of which can be controlled independently of one another, and it emits forward beams 11a, 12a and 13a and backward beams 11b, 12b and 13b along the three parallel axes. A photodetector 2 is set on the L-shaped block 5 so as to receive the backward beams 11b, 12b and 13b. The photodetector 2 includes photodetector elements 21, 22 and 23 for monitoring intensities of the backward beams 11b, 12b and 13b, respectively. The block 5 is fixed on a stem 8 and is closed in a cover cap 7 having a window 6. The forward beams 11a, 12a and 13a are focused on an optical memory medium (not shown) by a lens system (not shown) through the window 6. distance between the respective adjacent beam axes need to be considerably small, i.e., in a range of 70 to 100 μm in making account of a recording density.

FIG. 2 is a schematic illustration showing geometrical relations of the backward beams 11b, 12b and 13b to the photodetector elements 21, 22 and 23. In FIG. 2, each of the distances between the adjacent beam axes 11, 12 and 13 is 100 μm and the photodetector elements 21, 22 and 23 intersect with the beam axes 11, 12 and 13, respectively. As shown in this figure, if the distance between the semiconductor laser 1 and the photodetector 2 is large, the photodetector elements 21, 22 and 23 receive not only the corresponding beams 11b, 12b and 13b but also outer parts of the adjacent diverged beams. Therefore, the outputs of the three laser resonators cannot be accurately monitored independently of one another.

In the case of the divergence angle θ of each beam being 10°, overlap between the adjacent diverged beams does not occur on the photodetector 2 if the distance between the semiconductor laser 1 and the photodetector 2 is less than 500 μm. In that case, however, each of the intervals of light receiving areas of the photodetector elements 21, 22 and 23 need to be 10 to 30 μm. Accordingly, if the photodetector is of an integration type, electric current of about 0.1 to 2% leaks between the adjacent photodetector elements, causing crosstalk. Thus, the outputs of the three laser resonators cannot be accurately monitored independently.

SUMMARY OF THE INVENTION

In view of the prior art, an object of the present invention is to provide a multibeam laser device capable of accurately monitoring outputs of a plurality of laser resonators independently.

Another object of the present invention is to provide a waveguide which prevents the plurality of laser beams from interfering with one another.

Still another object of the present invention is to provide a waveguide causing little attenuation in intensities of laser beams.

A further object of the present invention is to provide a waveguide which can be accurately positioned with respect to incident laser beams and photodetector elements.

According to an aspect of the present invention, a semiconductor laser device comprises: a semiconductor laser including laser resonators for emitting laser beams in two opposite directions, e.g., forward and backward along a plurality of parallel axes; a photodetector including photodetector elements for detecting intensities of the laser beams emitted backward; and a waveguide located between the semiconductor laser and the photodetector, for guiding the backward emitted laser beams to the corresponding photodetector elements, the waveguide including a plurality of guide grooves for guiding the backward emitted laser beams.

According to another aspect of the present invention, a semiconductor laser device comprises: a semiconductor laser including laser resonators for emitting laser beams in two opposite directions, e.g., forward and backward along a plurality of parallel axes; a photodetector including photodetector elements for detecting intensities of the laser beams emitted backward; and a waveguide located between the semiconductor laser and the photodetector, for guiding the backward emitted laser beams to the corresponding photodetector elements, the waveguide including a plurality of guide grooves for guiding the backward emitted laser beams, and a width of any guide groove having an angle with respect to the axis of the corresponding resonator being larger than a width of any guide groove extending along the axis of the corresponding resonator.

According to a further aspect of the present invention, a semiconductor laser device comprises: a semiconductor laser including laser resonators for emitting laser beams in two opposite directions, e.g., forward and backward along a plurality of parallel axes; a photodetector including photodetector elements for detecting intensities of the laser beams emitted backward; and a waveguide located between the semiconductor laser and the photodetector, for guiding the backward emitted laser beams to the corresponding photodetector elements, the waveguide including a plurality of guide grooves for guiding the backward emitted laser beams, and widths of those guide grooves being made larger according to increase of angles of the grooves with respect to the axes of the corresponding resonators.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 9A, 9B and 9C are views for explaining a manufacturing process of the waveguide of FIG. 8.

FIG. 10 is a view showing a waveguide in a still further embodiment of the present invention.

DESCRIPTION OF THE PREFERRED EMBODIMENTS

Figure 1:
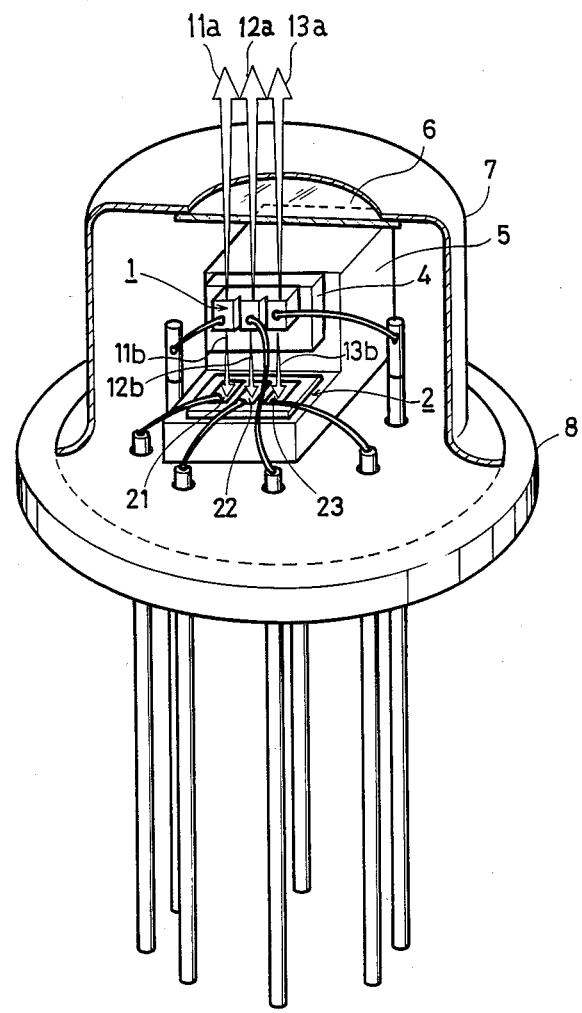
FIG. 1 is a perspective view of a multibeam laser device of the prior art, a cover cap thereof being partially cut away.
Figure 2:
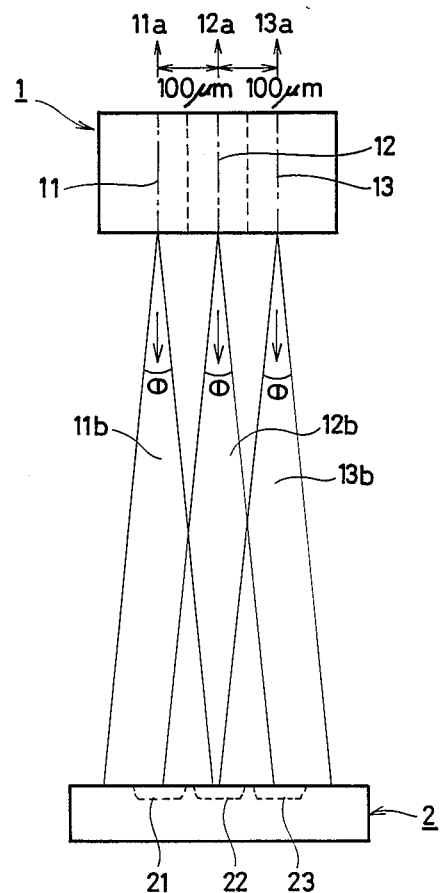
FIG. 2 is an illustration for explaining geometrical relations between laser beams and photodetector elements.
Figure 3:
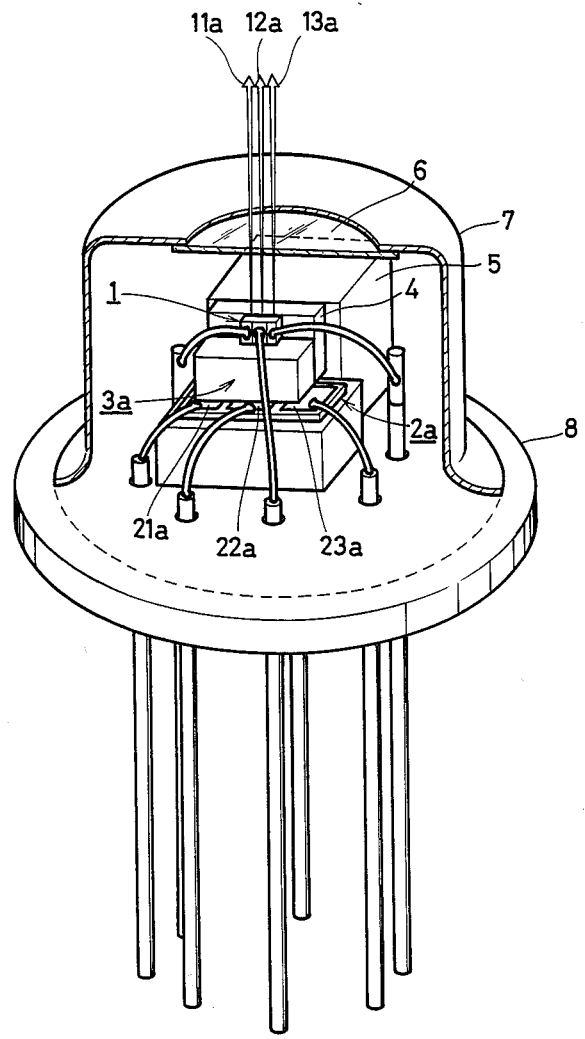
FIG. 3 is a perspective view of a multibeam laser device of an embodiment of the present invention, a cover cap thereof being partially cut away.

In FIG. 3, a multibeam laser device of an embodiment of the present invention is schematically illustrated. The device of FIG. 3 is similar to the device of FIG. 1, except that a waveguide 3a is provided between a semiconductor laser 1 and a photodetector 2a in the device of FIG. 3.

Figure 4A:
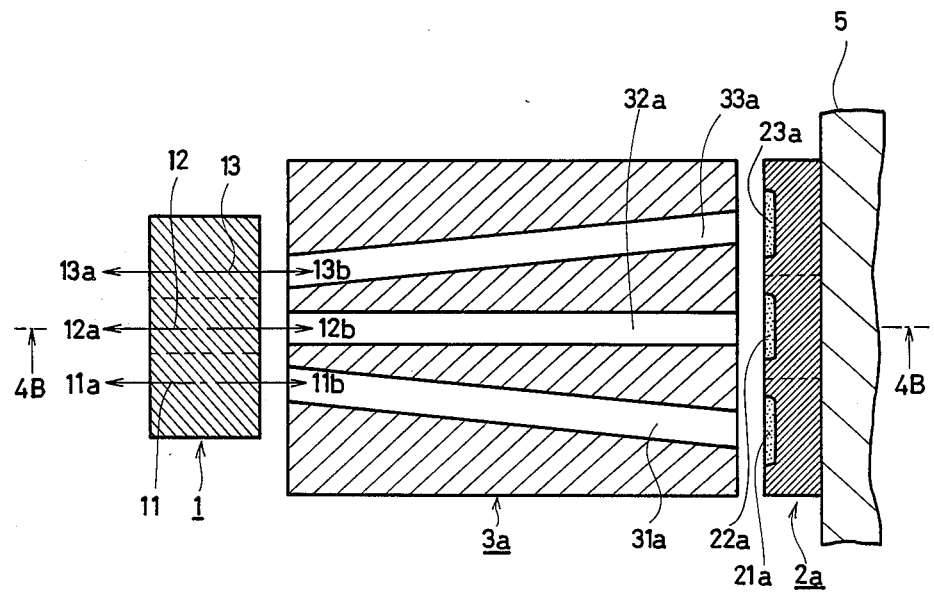
FIG. 4A is a main part sectional view taken along a plane including three laser beam axes of the device of FIG. 3.
Figure 4B:
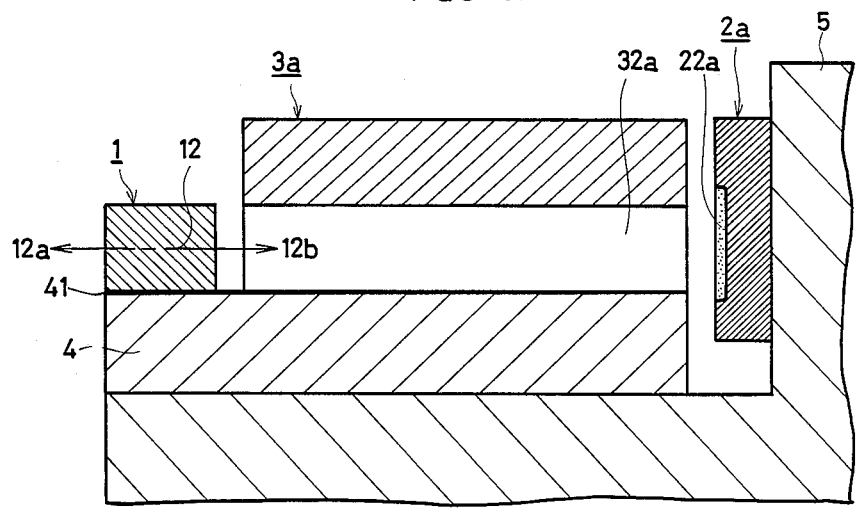
FIG. 4B is a sectional view taken along line 4B—4B in FIG. 4A.

A main portion of the device of FIG. 3 is schematically illustrated as sectional views in FIGS. 4A and 4B. In those figures, the semiconductor laser 1 is set on a heat sink 4 of silicon through an inverting layer 41 of indium. The intervening layer 41 of indium permits a good thermal contact between the semiconductor laser 1 and the heat sink 4. A waveguide 3a of silicon including guide grooves 31a, 32a and 33a is also set on the heat sink 4. The heat sink 4 is fixed on an L-shaped block 5 of copper or the like. The semiconductor laser 1 includes three lasers resonators, the outputs of which can be controlled independently of one another, and it emits forward beams 11a, 12a and 13a and backward beams 11b, 12b and 13b along three parallel axes 11, 12 and 13. The forward beams 11a, 12a and 13a are focused on an optical memory medium (not shown) by means of a lens system (not shown). The backward beams 11b, 12b and 13b are guided through the guide grooves 31a, 32a and 33a of the waveguide 3a, respectively, so that the distance between the neighboring beams is increased. The photodetector 2a includes three photodetector elements 21a, 22a and 23a. The photodetector 2a is set on the L-shaped block 5 so that the guided backward beams 11b, 12b and 13b may be received by the elements 21a, 22a and 23a, respectively. Thus, the distance between the respective adjacent photodetector elements 21a, 22a and 23a can be increased to 100 to 1000 μm for example. Accordingly, the above described crosstalk can be prevented and each element never receive the outer parts of the adjacent beams. As a result, the outputs of the three laser resonators in the semiconductor laser 1 can be accurately monitored independently of one another and the intensities of the forward beams 11a, 12a and 13a focused on the optical memory medium can be accurately controlled independently.

Figure 5:
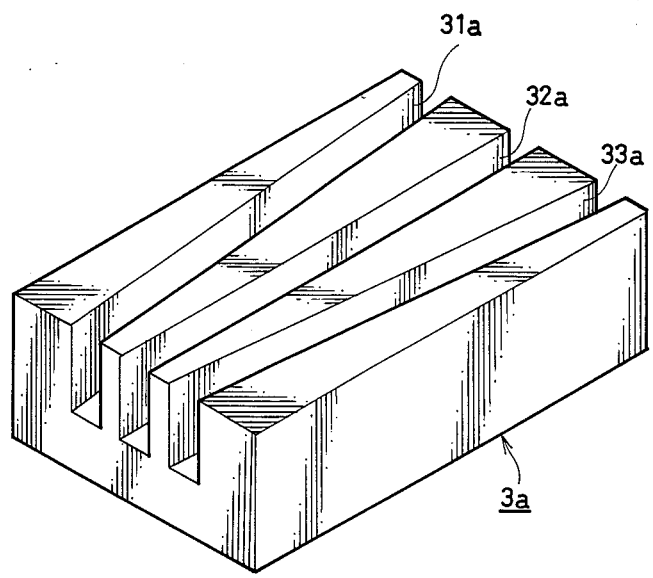
FIG. 5 is a perspective view of a waveguide in the embodiment of FIG. 3.

FIG. 5 is a schematic perspective view of the waveguide 3a. The guide grooves 31a, 32a and 33a are formed on a silicon body by using a cutting tool or by an etching process and each groove has a width of 60 μm and a depth of 250 μm for example. The outer guide grooves 31a and 33a are symmetrical with respect to the central guide groove 32a having a length of about 900 μm and they have an angle of 20° for example with respect to the central groove 32a. In FIG. 4A, the outer guide grooves 31a and 33a have an angle with respect to the optical axes 11 and 13, respectively, and the central guide groove 32a extends along the optical axis 12. Accordingly, the respective walls of the guide grooves 31a and 33a have a larger probability of beam reflection than that of the wall of the guide groove 32a. Thus, attenuation degrees of the intensities of the outer beams 11b and 13b due to the reflections are larger than an attenuation degree of the central beam 12b. Therefore, those grooves 31a, 32a and 33a are preferably coated with a reflective metal of gold or the like to cause less attenuation in the intensities of the beams due to reflections. Such coating is applied for example by an evaporation process.

Figure 6:
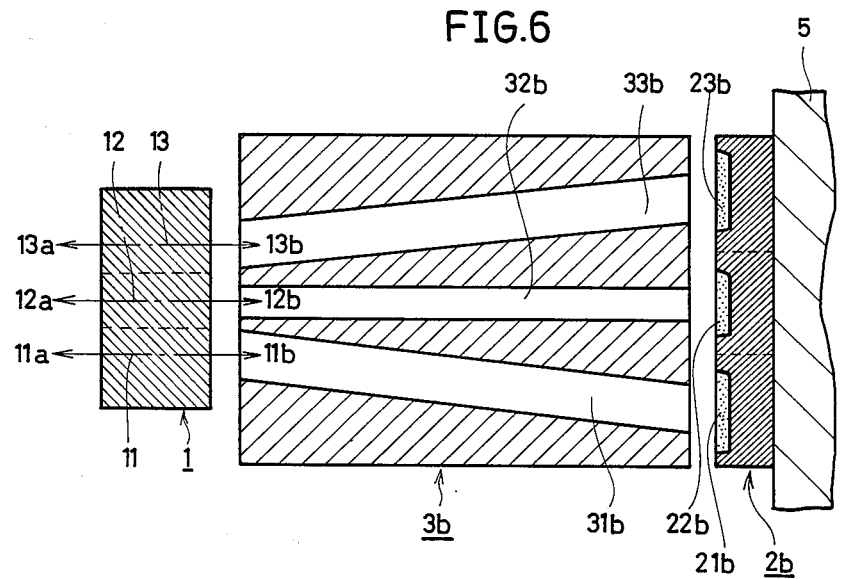
FIG. 6 is a main part sectional view of a multibeam laser device of another embodiment of the present invention.

FIG. 6 is a schematic illustration of another embodiment of the present invention. Although the device of FIG. 6 is similar to the device of FIG. 4A, the width of each of outer guide grooves 31b and 33b having angles with the beam axes 11 and 13 is larger than the width of a central guide groove 32b extending along the beam axis 12. Accordingly, the probability of beam reflections on the walls of the guide grooves 31b and 33b is decreased and less attenuation is caused in the intensities of the beams 11b and 13b. Generally, the width of a groove is preferably made larger according to increase of the angle of the groove to the corresponding beam axis. More preferably, the grooves 31b and 33b having the large width are coated with a reflective metal by an evaporation process. Then, if the outputs of the three resonators of the semiconductor laser 1 are the same, a ratio from 1:3:1 to about 1:1:1 can be obtained as a ration of the intensities of the beams 11b, 12b and 13b measured by the photodetector elements 21b, 22b and 23b, respectively. In addition, since the beams from the outlets of the wider guide grooves 31b and 33b are diverged with a larger angle than that in the case of the beam from the outlet of the narrower groove 32b, it is preferable to set the width of the respective photodetector elements 21b and 23b to be sufficiently larger than the width of the respective grooves 31b and 33b.

Figure 7:
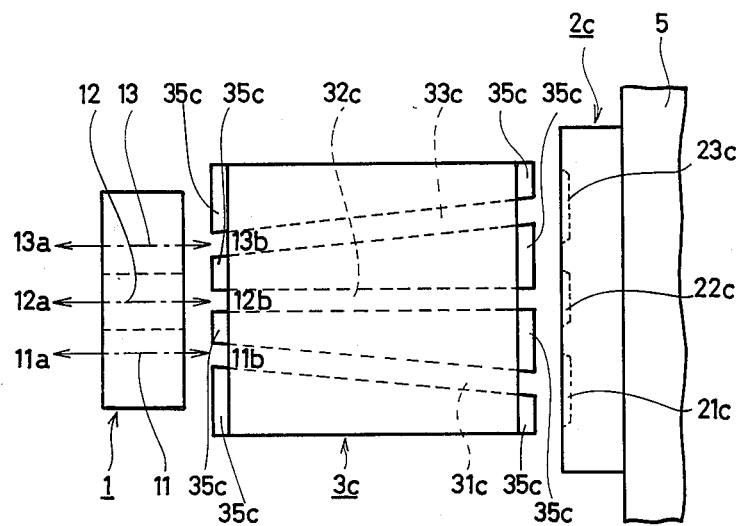
FIG. 7 is an illustration showing a waveguide in a further embodiment of the present invention.

Referring to FIG. 7, still another embodiment of the present invention is schematically illustrated. Although the device of FIG. 7 is similar to the device of FIG. 4A, they are different in that a waveguide 3c in FIG. 7 has projections 35c extending along the guide grooves 31c, 32c and 33c. In this embodiment of FIG. 7, the projections 35c make it possible to precisely detect the positions of the inlets and the outlets of the guide grooves 31c, 32c and 33c. Thus, the guide grooves 31c, 32c and 33c can be correctly positioned easily with respect to the optical axes 11, 12 and 13 and the photodetector elements 21c, 22c and 23c, respectively.

Figure 8:
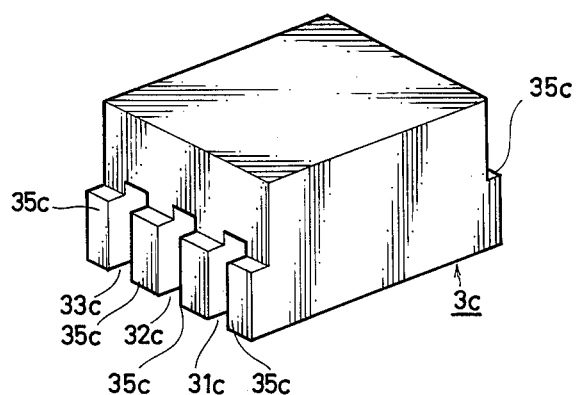
FIG. 8 is a perspective view of the waveguide shown in FIG. 7.

FIG. 8 is a schematic perspective view of the waveguide 3c in the device of FIG. 7.

FIGS. 9A to 9C are schematic illustrations of a manufacturing process of the waveguide 3c of FIG. 8. Referring to FIG. 9A, grooves 38 are cut on an upper surface of a silicon plate 30 by means of a cutting tool or in an etching process. Subsequently, as shown in FIG. 9B, guide grooves 31c, 32c and 33c are cut on the lower surface of the silicon plate 30. Then, as shown in FIG. 9C, a waveguide 3c is separated from the silicon plate 30 by means of narrower grooves 39 than the grooves 38. Each projection 35c may be projected by about 10 to 100 μm along the guide groove.

FIG. 10 schematically illustrates a waveguide of a still further embodiment of the present invention. Both ends of the waveguide 3d have inclined surfaces and the positions of the guide grooves 31d, 32d and 33d can be easily detected based on the inclined projections 35d.

Although the guide grooves are described in the above embodiments, those guide grooves may be replaced by through holes.

In addition, if it is only necessary to prevent overlap of beams, the guide grooves may be parallel to one another.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser assembly comprising:
   semiconductor laser means including a plurality of laser resonators each for emitting laser beams forward and backward in two opposite directions along a plurality of parallel axes,
   photodetector means including a plurality of photodetector elements each positioned for receiving and for detecting the intensity of a single corresponding backward emitted laser beam, and
   waveguide means located between said semiconductor laser means and said photodetector means, for guiding said backward emitted laser beams to the corresponding ones of said photodetector elements, said waveguide means including a plurality of guide channels each for guiding one of said backward emitted laser beams to its corresponding photodetector element.

2. A semiconductor laser assembly in accordance with claim 1, wherein said waveguide means is formed of silicon.

3. A semiconductor laser assembly in accordance with claim 1, wherein at least one of said guide channels is coated with a light reflective metal.

4. A semiconductor laser assembly in accordance with claim 1, further comprising a heat sink, said semiconductor laser means and said waveguide means being mounted on said heat sink.

5. A semiconductor laser assembly in accordance with claim 1, wherein said photocondetector elements each have a larger light receiving area than an outlet opening of the corresponding one of the guide channels.

6. A semiconductor laser assembly in accordance with claim 1, wherein said waveguide means further comprises means for indicating the positions of said guide channels.

7. A semiconductor laser assembly comprising:
   semiconductor laser means including a plurality of laser resonators each for emitting laser beams forward and backward in two opposite directions along a plurality of parallel axes,
   photodetector means including a plurality of photodetector elements each positioned for receiving and for detecting the intensity of a single corresponding backward emitted laser beam, and
   waveguide means located between said semiconductor laser means and said photodetector means, for guiding said backward emitted laser beams to the corresponding ones of said photodetector elements, said waveguide means including a plurality of guide channels each for guiding one of said backward emitted laser beams to its corresponding photodetector element, the width of each of the guide channels positioned at an angle with said laser beam axes being larger than the width of a guide channel extending along said axes.

8. A semiconductor laser assembly in accordance with claim 7, wherein said waveguide means is of silicon.

9. A semiconductor laser assembly in accordance with claim 7, wherein at least one of said guide channels is coated with a light reflective metal.

10. A semiconductor laser assembly in accordance with claim 7, further comprising a heat sink, said semiconductor laser means and said waveguide means being mounted on said heat sink.

11. A semiconductor laser assembly in accordance with claim 7, wherein said photodetector elements each have a larger light receiving area than an outlet opening of the corresponding one of said guide channels.

12. A semiconductor laser assembly in accordance with claim 7, wherein said waveguide means further comprises means for displaying positions of inlets and outlets of said guide grooves.

13. A semiconductor laser assembly comprising:
   semiconductor laser means including a plurality of laser resonators each for emitting laser beams forward and backward in two opposite directions along a plurality of parallel axes,
   photodetector means including a plurality of photodetector elements each positioned for receiving and for detecting the intensity of a single corresponding laser beam emitted backward, and
   waveguide means located between said semiconductor laser means and said photodetector means for guiding said backward emitting laser beams to the corresponding ones of said photodectector elements, said waveguide means including a plurality of guide channels each for guiding one of said backward laser beams to its corresponding photodetector element, the width of the respective guide channels being increased according to the increase in the angle of the guide channel with respect to said axes of said laser beams.

14. A semiconductor laser assembly in accordance with claim 13, wherein said waveguide means is formed of silicon.

15. A semiconductor laser assembly in accordance with claim 13, wherein at least one of said guide channels is coated with a light reflective metal.

16. A semiconductor laser assembly in accordance with claim 13 further comprising a heat sink, said semiconductor laser means and said waveguide means being mounted on said heat sink.

17. A semiconductor laser assembly in accordance with claim 13, wherein said photodetector elements each have a larger light receiving area than an outlet opening of the corresponding one of said guide channels.

18. A semiconductor laser assembly in accordance with claim 13, wherein said waveguide means further comprises means for indicating the positions of the inlets and outlets of said guide channels.

19. A semiconductor laser assembly as in claim 1 wherein said guide channels are formed as grooves in said waveguide means.

20. A semiconductor laser as in claim 1 wherein said guide channels are formed as through holes in said waveguide means.

21. A semiconductor laser assembly as in claim 7 wherein said guide channels are formed as grooves in said waveguide means.

22. A semiconductor laser as in claim 7 wherein said guide channels are formed as through holes in said waveguide means.

23. A semiconductor laser assembly as in claim 13 wherein said guide channels are formed as grooves in said waveguide means.

24. A semiconductor laser as in claim 13 wherein said guide channels are formed as through holes in said waveguide means.

* * * * *

UNITED STATES PATENT AND TRADEMARK OFFICE
CERTIFICATE OF CORRECTION

PATENT NO. : 4,847,848
DATED : July 11, 1989
INVENTOR(S) : Yasuaki Inoue It is certified that error appears in the above—identified patent and that said Letters Patent is hereby corrected as shown below:

On the title page, item [75]:
The fourth inventor was deleted from the indication of inventors.

Therefore, please correct the patent to include the fourth inventor as follows:

From "Yasuaki Inoue, Kyoto; Kimihide Minakuchi; Norio Tabuchi, both of Osaka, all of Japan"

To: --Yasuaki Inoue, Kyoto; Kimihide Minakuchi, Osaka; Norio Tabuchi, Osaka; Kazushi Mori, Osaka, all of Japan--

Signed and Sealed this

Nineteenth Day of May, 1992

*Attest:*

DOUGLAS B. COMER

*Attesting Officer*     *Acting Commissioner of Patents and Trademarks*